(12) United States Patent
Tang et al.

(10) Patent No.: US 8,322,668 B2
(45) Date of Patent: Dec. 4, 2012

(54) MOUNTING APPARATUS FOR SLIDE RAIL

(75) Inventors: Chen-Sheng Tang, Tu-Cheng (TW);
Shu-Chen Lin, Tu-Cheng (TW);
Hsueh-Chin Lu, Tu-Cheng (TW);
Hung-Ting Su, Tu-Cheng (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 0 days.

(21) Appl. No.: 13/078,004

(22) Filed: Apr. 1, 2011

(65) Prior Publication Data
US 2012/0175477 A1 Jul. 12, 2012

(30) Foreign Application Priority Data
Jan. 12, 2011 (TW) .............................. 100101167 A

(51) Int. Cl.
*A47B 96/00* (2006.01)
(52) U.S. Cl. ........... 248/222.14; 248/220.21; 248/224.8; 312/334.4; 211/175
(58) Field of Classification Search ......................... None
See application file for complete search history.

(56) References Cited

U.S. PATENT DOCUMENTS

| 6,926,378 | B2* | 8/2005 | Greenwald et al. | 312/334.4 |
| 6,988,626 | B2* | 1/2006 | Varghese et al. | 211/26 |
| 7,255,409 | B2* | 8/2007 | Hu et al. | 312/334.4 |
| 7,357,362 | B2* | 4/2008 | Yang et al. | 248/221.11 |
| 7,552,899 | B2* | 6/2009 | Chen et al. | 248/224.8 |
| 7,988,246 | B2* | 8/2011 | Yu et al. | 312/334.4 |

* cited by examiner

*Primary Examiner* — Terrell McKinnon
*Assistant Examiner* — Monica Millner
(74) *Attorney, Agent, or Firm* — Altis Law Group, Inc.

(57) ABSTRACT

A mounting apparatus for a slide rail includes a post, a mounting bracket, a fixing plate, and two fasteners. The post longitudinally defines two positioning holes. The mounting bracket is capable of being connected to an end of the slide rail. An end plate is formed on an end of the mounting bracket, and two through holes are defined in the end plate. The fixing plate defines two fixing holes. The fasteners are respectively extended through the positioning holes of the post and the through holes of the end plate, and engaged in the fixing holes of the fixing plate, to allow the fixing plate to be locked to the post. The mounting bracket is transversely slidably coupled to the post and the fixing plate via the two fasteners.

7 Claims, 4 Drawing Sheets

MOUNTING APPARATUS FOR SLIDE RAIL

BACKGROUND

1. Technical Field

The present disclosure relates to a mounting apparatus for a slide rail.

2. Description of Related Art

Typically, there are two slide rails mounted between a server and a rack to allow the server to move along the rack. However, because the racks are not manufactured to precise widths, sometimes, the racks do not match the distance between two mounting brackets that are fixed to opposite sides of the rack, making installation of the racks difficult. Therefore, there is room for improvement within the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
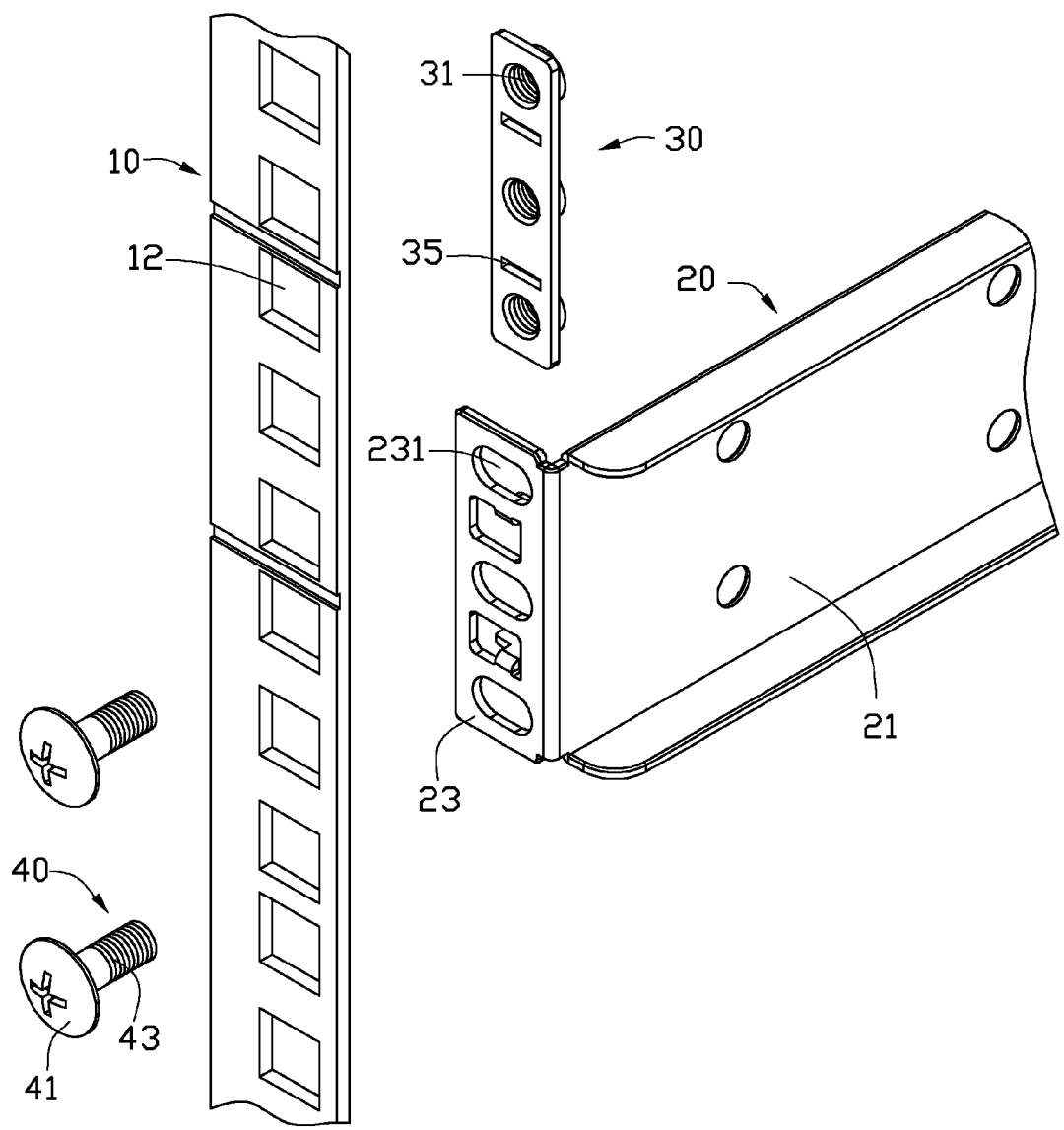
FIG. 1 is an exploded, isometric view of an embodiment of a mounting apparatus.
Figure 2:
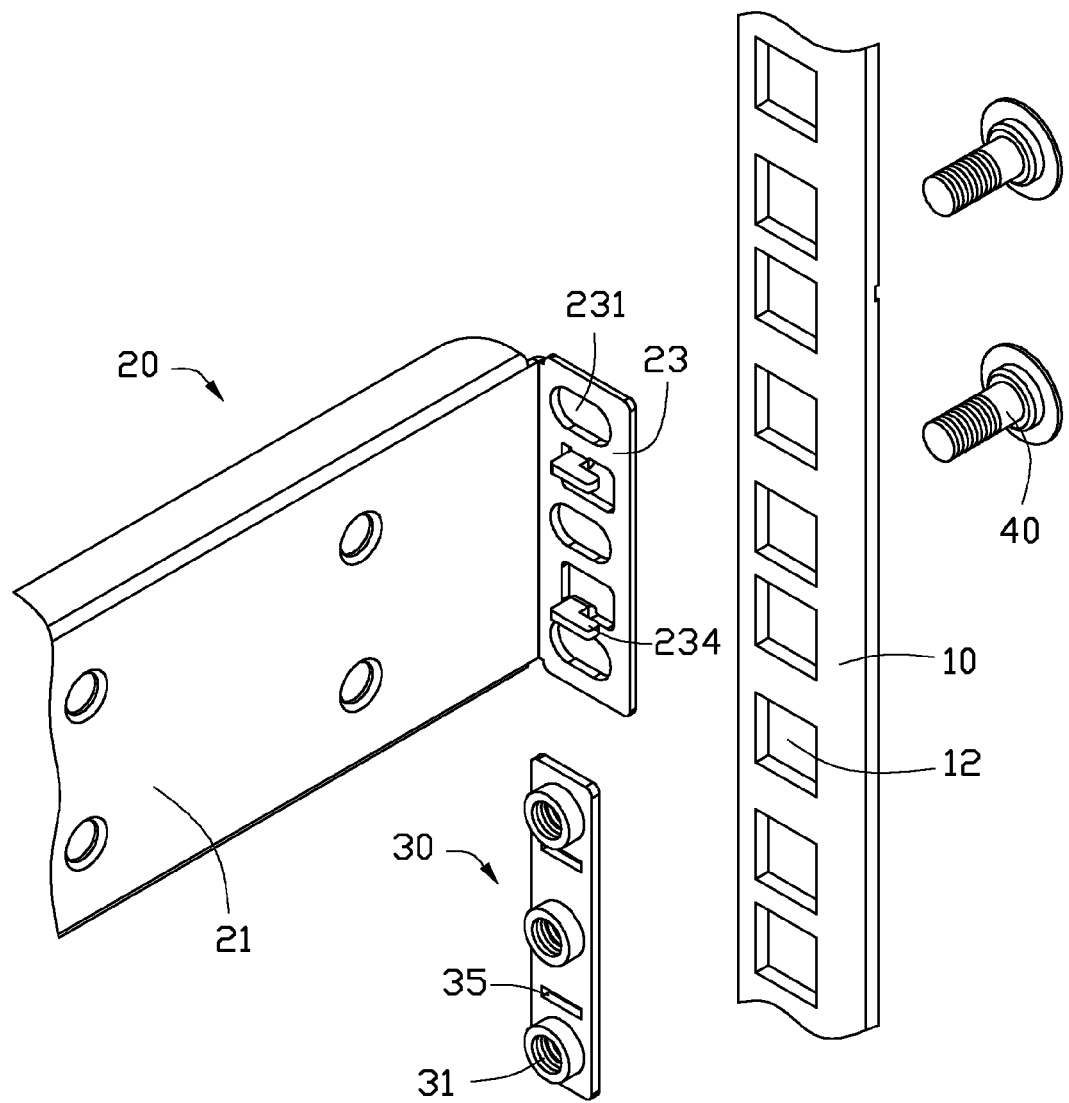
FIG. 2 is similar to FIG. 1, but viewed from another perspective.

Referring to FIGS. 1 and 2, an embodiment of a mounting apparatus includes a post 10, a mounting bracket 20, a fixing plate 30, and two fasteners 40.

The post 10 longitudinally defines a plurality of positioning holes 12. In this embodiment, each of the positioning holes 12 is square-shaped. In another embodiment, each of the positioning holes 12 is circular.

The mounting bracket 20 includes a side plate 21 capable of being connected to an outer portion of a slide rail 50 (see FIG. 4), and an end plate 23 perpendicularly extending from the front end of the side plate 21. The end plate 23 longitudinally defines three transversely extending through holes 231. Two L-shaped hooks 234 transversely extend from the backside of the end plate 23.

The fixing plate 30 longitudinally defines three circular fixing holes 31, corresponding to the through holes 231 of the end plate 23. The diameter of each fixing hole 31 is less than the length of the corresponding through hole 231, and substantially equal to the width of the corresponding through hole 231. Two transversely extending slots 35 are defined in the fixing plate 30, corresponding to the hooks 234 of the end plate 23.

Each fastener 40 includes a head 41, and a shaft 43 extending from the backside of the head 41, for engaging in a corresponding fixing hole 31 of the fixing plate 30. In this embodiment, the fasteners 40 are screws, and the fixing holes 31 are threaded holes.

Figure 3:
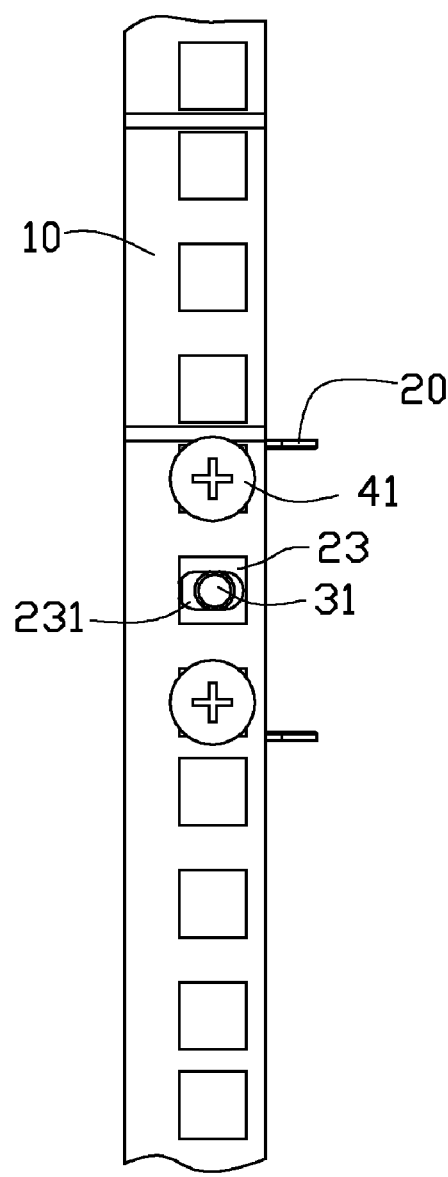
FIG. 3 is an assembled, front elevational view of FIG. 1.
Figure 4:
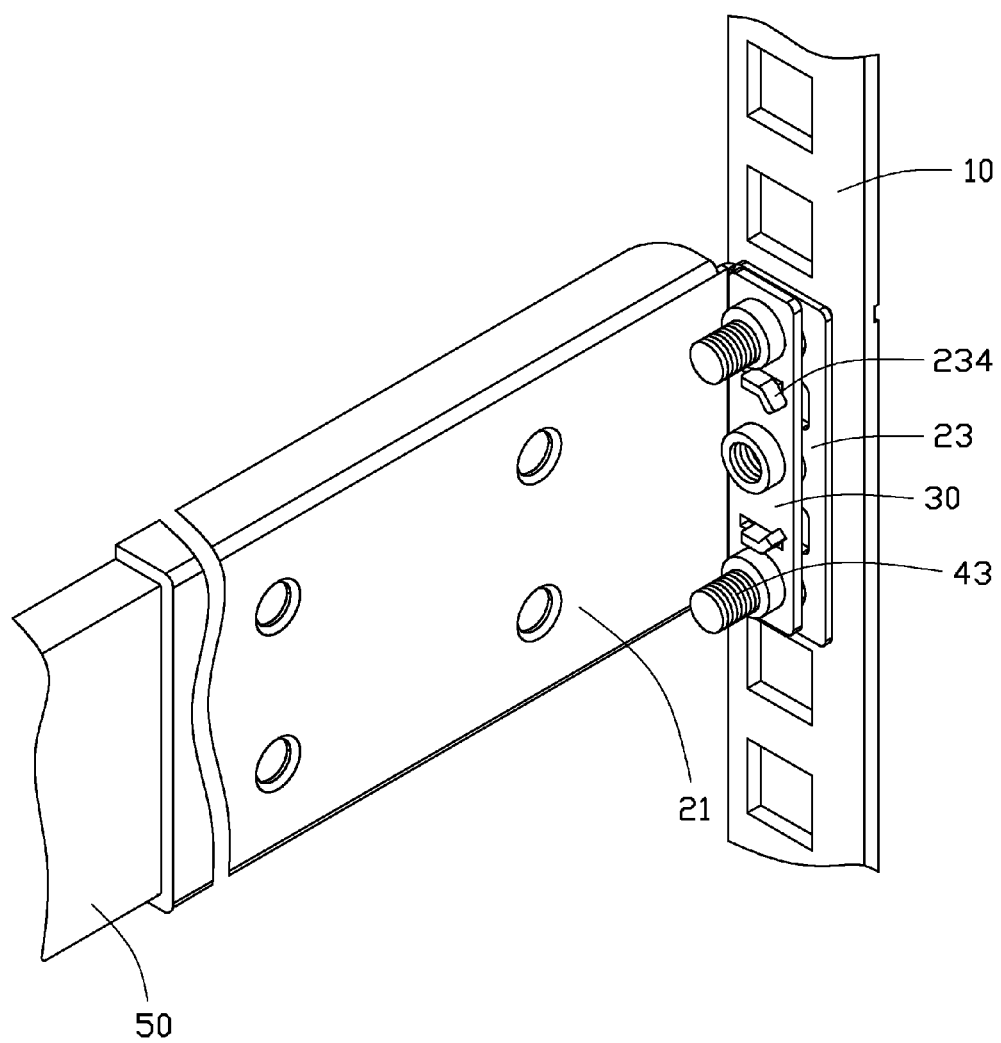
FIG. 4 is an assembled, isometric view of a slide rail together with the mounting apparatus of FIG. 2.

Referring to FIGS. 3 and 4, in assembly, the mounting bracket 20 is fixed to an end of the slide rail 50. The hooks 234 of the mounting bracket 20 are extended through the corresponding slots 35 of the fixing plate 30, and are bent to engage with the backside of the fixing plate 30. Thereby, the fixing plate 30 is slidably connected to the backside of the end plate 23 of the mounting bracket 20. The fixing holes 31 of the fixing plate 30 are aligned with the corresponding through holes 231 of the end plate 23. The front side of the end plate 23 is abutted against the backside of the post 10, to allow the fixing holes 31 of the fixing plate 30 to align with the corresponding positioning holes 12 of the post 10. The shafts 43 of the fasteners 40 are extended through two corresponding positioning holes 12 and two corresponding through holes 231, and engage in two corresponding fixing holes 31. Thereby, the fixing plate 30 is locked to the post 10. The end plate 23 of the mounting bracket 20 is sandwiched between the post 10 and the fixing plate 30. The slide rail 50 mounted to the mounting bracket 20 is capable of transversely sliding relative to the post 10 and the fixing plate 30 along the through holes 231 and the slots 35.

Then another mounting apparatus is used to mount the opposite end of the slide rail 50 to another post in a rack on a same side as the post 10. To mount a server onto the rack, the slide rail 50 is transversely moved together with the mounting brackets 20, to adjust the distance between the slide rail 50 and the other slide rail on the opposite side of the rack, to allow the server to be easily mounted between the slide rails, and smoothly slide relative to the rack.

In other embodiments, the mounting bracket 20 may be integrally formed on an end of the slide rail 50 or slidably connected to an end of the slide rail 50.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A mounting apparatus for a slide rail, the mounting apparatus comprising:

a post longitudinally defining two positioning holes;

a mounting bracket to be connected to an end of the slide rail, an end plate formed on an end of the mounting bracket, and two through holes defined in the end plate and aligning with the two positioning holes of the post;

a fixing plate defining two fixing holes aligning with the two positioning holes of the post; and two fasteners respectively extended through the positioning holes of the post and the through holes of the end plate, and engaging in the fixing holes of the fixing plate, to allow the fixing plate to be locked to the post, and the mounting bracket is transversely slidably coupled to the post and the fixing plate via the two fasteners, wherein two hooks extend from a side of the end plate away from the post, two slots are defined in the fixing plate, the hooks are respectively extended through the slots of the fixing plate and engage with a side of the fixing plate away from the post, the hooks are slidable relative to the fixing plate along the slots.

2. The mounting apparatus of claim 1, wherein the hooks are substantially L-shaped.

3. The mounting apparatus of claim 1, wherein the mounting bracket is integrally formed on the end of the slide rail.

4. The mounting apparatus of claim 1, wherein the mounting bracket further comprises a side plate to be connected to an outer portion of the slide rail, the end plate extends from an end of the side plate away from the slide rail.

5. The mounting apparatus of claim 1, wherein the fixing holes are circular, a diameter of each fixing hole is less than a length of a corresponding one of the through holes.

6. The mounting apparatus of claim 5, wherein the diameter of each fixing hole is substantially equal to a width of the corresponding one of the through holes.

7. The mounting apparatus of claim 6, wherein the fasteners are screws, and the fixing holes are threaded holes.

* * * * *